US008076003B2

(12) United States Patent
Mengel et al.

(10) Patent No.: US 8,076,003 B2
(45) Date of Patent: Dec. 13, 2011

(54) COATING COMPOSITION AND A METHOD OF COATING

(75) Inventors: Manfred Mengel, Bad Abbach (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 366 days.

(21) Appl. No.: 12/239,096

(22) Filed: Sep. 26, 2008

(65) Prior Publication Data

US 2010/0078782 A1    Apr. 1, 2010

(51) Int. Cl.
*B32B 9/04*      (2006.01)
(52) U.S. Cl. ......... 428/446; 525/104; 525/474; 257/666
(58) Field of Classification Search .................. 525/104, 525/474; 428/446; 257/666
See application file for complete search history.

(56) References Cited

U.S. PATENT DOCUMENTS

| 5,194,338 | A  | * | 3/1993  | Niebylski ...................... 428/446 |
| 2002/0035222 | A1 |   | 3/2002  | Oh et al. |
| 2002/0161151 | A1 |   | 10/2002 | Oh et al. |
| 2003/0107112 | A1 |   | 6/2003  | Tellkamp |
| 2004/0188810 | A1 |   | 9/2004  | Tellkamp |
| 2005/0048298 | A1 |   | 3/2005  | Howell et al. |
| 2005/0121330 | A1 |   | 6/2005  | Howell et al. |
| 2006/0036007 | A1 | * | 2/2006  | Hsieh et al. ................... 524/104 |
| 2007/0176267 | A1 | * | 8/2007  | Abbott .......................... 257/666 |
| 2008/0214744 | A1 | * | 9/2008  | Tsuchida et al. .............. 525/474 |

FOREIGN PATENT DOCUMENTS

| DE | 284255 A5 | 11/1990 |
| JP | 56122884 A | 9/1981 |
| WO | 2008031781 A2 | 3/2008 |

* cited by examiner

*Primary Examiner* — Tan N Tran
(74) *Attorney, Agent, or Firm* — Dicke, Billig & Czaja, PLLC

(57) ABSTRACT

A coating composition including a compound having a first molecular group or a first combination of atoms, the first molecular group or the first combination of atoms capable of bonding to an oxidizable metal or a metal oxide, and a second molecular group or a second combination of atoms, the second molecular group or the second combination of atoms capable of interacting with a precursor of a polymer so the compound and the polymer are bound together.

26 Claims, 1 Drawing Sheet

COATING COMPOSITION AND A METHOD OF COATING

BACKGROUND

The present invention generally relates to a coating composition and to a method of using the coating composition. More particularly, the present invention relates to a coating composition capable of bonding to both oxidizable metal and a polymeric coating and to a method of using the coating composition during manufacture of small electronic devices.

Small electronic devices based on lead frames carry microelectronic components, such as an integrated circuit (IC) chip, typically have exposed metal portions that are subject to oxidation and, thus, corrosion. Lead frames, for example may be constructed of copper; aluminum; nickel; a noble metal, or various ferrous alloys that are all potentially oxidizable to some degree. After manufacture, lead frames are typically treated with an anticorrosion coating to inhibit corrosion prior to attachment of components to the lead frame. Adhesive bonding of microelectronic components, such as a microchip made of semiconductor material, to the lead frame may complicate the corrosion issue. Also, the industry practice of encapsulating at least a portion of the small electronic device in plastic can further complicate the corrosion issue.

Various attempts have been made to supply anticorrosion coatings that may be applied to exposed metal portions of small electronic devices to inhibit or eliminate corrosion. While some of these anticorrosion coatings may offer adequate corrosion protection, at least in some circumstances, adhesion of bonding materials to the underlying lead frame and adhesion of the encapsulating plastic coating, sometimes referred to as "packaging" the small electrical component, remains problematic.

Some anticorrosion coatings are so problematic to adhesion of bonding materials and encapsulating plastic coatings that removal of these anticorrosion coatings is typically undertaken prior to applying the bonding material or the encapsulating plastic coating. This solution is unsatisfactory for a number of reasons. First, this solution adds an additional step to the manufacture of small electronic components that requires both additional resources and time. Furthermore, it can be difficult, if not impossible, to remove all anticorrosion coating material from all coated surfaces. Difficulties can arise from the geometries of surfaces coated with anticorrosion coatings. Also, non-metallic surfaces (ceramic, for example) can exist in small electronic devices. It can be challenging, or at least impractical, to avoid application of anticorrosion coatings to these non-metallic surfaces. Removal of some anticorrosion coatings from non-metallic surfaces can be difficult, if not impossible, due to surface geometries of some coated non-metallic surfaces. Furthermore, use of etching chemicals may be required in some cases to effect removal of anticorrosion coatings. Practical difficulties in the course of applying these etching chemicals can undesirably alter properties of a component of the small electronic device.

Not all anticorrosion coatings are necessarily problematic to adhesion of bonding materials or encapsulating plastic coatings. However, for these anticorrosion coatings, another problem often arises. In particular, when electronic components are being thermally bonded in the course of manufacturing the small electronic components, the heat generated by the thermal bonding often causes anticorrosion coatings to either delaminate or desorb from the coated surface or even chemically decompose. Any delaminated or desorbed portions or residues from decomposed anticorrosion coating must be cleaned and recoated with anticorrosion coating before applying the encapsulating plastic coating, which again undesirably requires additional resources and adds time to the manufacturing process.

An alternative approach that has been tried, where existence of the anticorrosion coating is problematic to adhesion of the encapsulating plastic coating, entails applying an adhesion-improving coating over the anticorrosion coating. This approach, too, has generally not been satisfactory. The adhesion-improving coating is generally applied prior to diebonding of the semiconductor material that is etched to form a micro chip and conductive vias. Therefore, complete coverage of adhesion-improving coating on conductive areas within process windows is typically not realized. Another attempted solution entails electrolytic application of an adhesion-promoting coating after incorporation of the chip in the small electronic device. This approach is also unsatisfactory, since the electrolytically applied adhesion-promoting coating only attaches to conductive surfaces and leaves various substrate surfaces (i.e. ceramic, plastic) uncoated.

The various existing attempts to solve and adequately address the corrosion prevention issue and improved adhesion of bonding materials and encapsulating plastic coatings have increased the knowledge base pertinent to both issues. Nonetheless, a need still exists for a solution that both prevents corrosion of metal surfaces that are susceptible to corrosion while supporting firm attachment of bonding materials and encapsulating plastic coatings.

For these and other reasons there is a need for the present invention.

DESCRIPTION

Figure 1:
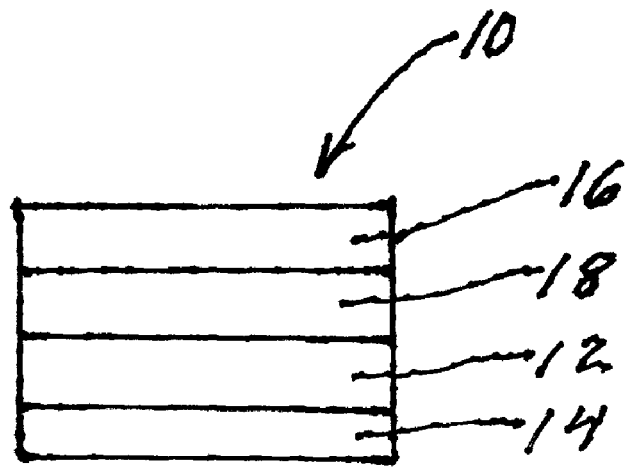
FIG. 1 is a schematic view of one embodiment of a microelectronic device incorporating a coating composition.

The present invention generally relates to a coating composition and to a method of using the coating composition. More particularly, the present invention relates to a coating composition capable of bonding to both oxidizable metal and a polymeric coating and to a method of using the coating composition during manufacture of small electronic devices, and packaging of electronic or semiconductor devices.

Throughout the drawings, like elements are referred to using like reference characters.

Various compounds capable of bonding to both oxidizable metal and a polymeric coating may be employed in the coating composition of the present invention. Such compounds may include a first molecular group or a first combination of atoms, where the first molecular group or the first combination of atoms is capable of bonding to an oxidizable metal or a metal oxide, and a second molecular group or a second combination of atoms, where the second molecular group or the second combination of atoms are capable of interacting with a precursor of a polymer so the compound and the polymer are chemically bound together.

One suitable example of the first molecular group capable of bonding to an oxidizable metal or a metal oxide is a silanol group (Si—OH). A suitable example of the first combination of atoms capable of bonding to an oxidizable metal or a metal oxide is a compound including a heterocyclic organic ring, where the heterocyclic organic ring includes two or more ring nitrogen atoms. In some embodiments, at least two of the ring nitrogen atoms are located adjacent to each other in the heterocyclic organic ring. It is believed that having at least two of the ring nitrogen atoms located adjacent to each other in the heterocyclic organic ring will typically enhance the bonding stability of the compound to the oxidizable metal or metal oxide due to increased sharing of electrons between the adjacent nitrogen atoms and enhanced concentration of electrons proximate the adjacent nitrogen atoms.

As used herein, the term "precursor of a polymer" means and includes monomers; oligomers; polymers; mixtures of monomers, oligomers and/or polymers; and any reactive chemical species which are capable of polymerization or copolymerization.

A suitable example of the second molecular group capable of interacting with a precursor of a polymer so the compound and the polymer are chemically bound together is a glycidyl group, an amino group (—NH$_2$), a hydroxyl group (—OH), or a thiol group (—SH). The glycidyl group is a 2,3-epoxypropyl group that may be represented by the following formula:

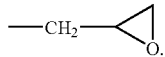

A suitable example of the second combination of atoms capable of interacting with a precursor of a polymer so the compound and the polymer are chemically bound together is a pair of carbon atoms that are double bonded to each other (C=C).

Substituted benzotriazoles, such as the substituted benzotriazoles represented by formula I below, are some non-exhaustive examples of compounds capable of bonding to both oxidizable metal and a polymeric coating that may be employed in the coating composition of the present invention:

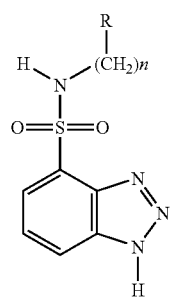

where —R may be —OH, —NH$_2$, —SH, or

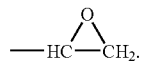

The number value of methylene (CH$_2$) groups in the substituted benzotriazole of formula I is not essential for achieving the capability of interacting with a precursor of a polymer so the substituted benzotriazole of formula I and the polymer are chemically bound together. Therefore, n in the substituted benzotriazole of formula I may be any whole number, though n will often range from 1 to 11.

The coating composition of the present invention may include one or more compounds according to formula I,
where R and/or n may vary between different compounds. There is no limit on the number of different compounds according to formula I that may be included in the coating composition.

Imidizoles, such as the substituted imidizoles represented by formula II below, are some additional non-exhaustive examples of compounds capable of bonding to both oxidizable metal and a polymeric coating that may be employed in the coating composition of the present invention:

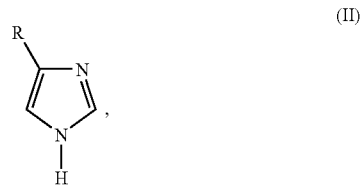

where-R may be —OH, —NH$_2$, —SH, or

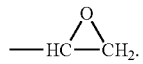

The coating composition of the present invention may include one or more compounds according to formula II, where R may vary between different compounds. There is no limit on the number of different compounds according to formula II that may be included in the coating composition.

Silane hydroxides are additional non-exhaustive examples of compounds capable of bonding to both oxidizable metal and a polymeric coating that may be employed in the coating composition of the present invention. The silane hydroxides usable in the composition may be Si(OH)n, where n may be any whole number ranging from 1 to 3. The coating composition of the present invention may include one or more different silane hydroxides. There is no limit on the number of different silane hydroxides that may be included in the coating composition.

The coating composition may include only one compound capable of bonding to both oxidizable metal and a polymeric coating. Alternatively, the coating composition may two or more different compounds capable of bonding to both oxidizable metal and a polymeric coating. For example, a combination of any compound represented by formula I above, any compound represented by formula II above, and/or any silane hydroxide described above may be included in the coating composition of the present invention. In addition, when compounds of formula I and formula II and any silane hydroxide described above are included in the coating composition, the coating composition may include (1) multiple different compounds according to formula I, where R and/or n may vary between different compounds according to formula I, (2) multiple different compounds according to formula II, where R may vary between different compounds according to formula II, and (III) multiple different silane hydroxides, where n may vary between different silane hydroxides.

The coating composition may be prepared by blending the compound(s) capable of bonding to both oxidizable metal and a polymeric coating with a liquid organic carrier, such as acetone, a ketone, cyclopentanone, or a blend of different liquid organic carriers. In various embodiments, liquid organic carriers with higher boiling points are employed since it has been found the coating of the coating composition, upon drying, is generally more homogeneous when liquid organic carriers with higher boiling points are employed.

The total concentration of the compound, or collectively of all compound(s), capable of bonding to both oxidizable metal and a polymeric coating in the coating composition may generally be as low as about 0.01 weight percent, based upon the total weight of the coating composition. The total concentration of the compound, or collectively of all compound(s), capable of bonding to both oxidizable metal and a polymeric coating in the coating composition of the present invention may generally range higher than about 0.01 weight percent, based upon the total weight of the coating composition, but will typically range up to only about ten weight percent, or less, based upon the total weight of the coating composition to minimize the thickness of the coating of the coating composition.

Besides the compound(s) capable of bonding to both oxidizable metal and a polymeric coating and the liquid organic carrier, the coating composition of the present invention may also include various additives. For example, the coating composition may include very small particles of elastomeric polymers, such as silicon polymers and isoprene polymers to help increase the flexibility of, and reduce internal stresses within, the coating of the coating composition, upon drying. The collective concentration of all elastomeric polymer(s) in the coating composition will generally be less than 1 weight percent, based on the total weight of the coating composition, and will more typically be about the same or less than the collective concentration of all compound(s) included in the coating composition that are capable of bonding to both oxidizable metal and a polymeric coating.

Other suitable additives includable in the coating composition include antioxidants and wetting agents. The coating composition should be capable of wetting the surface of the oxidizable metal upon application of the coating composition onto the surface of the oxidizable metal to aid in forming the coating with a uniform thickness in which the compounds included in the coating composition are homogeneously distributed. It is believed such wetting will generally occur in the absence of any wetting agent(s) to the coating composition, though appropriate wetting agent(s) may permissibly be added to the coating composition, as deemed necessary. Any additive(s) may generally be included in the coating composition, so long as the selected additive(s) do not unacceptably diminish or hinder desired application and performance characteristics of the coating composition or the coating formed from the coating composition.

The thickness of the coating of the coating composition on the oxidizable metal surface will typically be minimized to enhance the stability of the coating. Indeed, the coating composition may be applied to create a monolayer of the compound(s) included in the coating composition on the oxidizable metal surface. In some embodiments, after the coating of the coating composition has solidified following drying and optionally heating of the applied coating, the coating may have a thickness of less than 1 μm. In other embodiments, after the coating of the coating composition has solidified following drying and optionally heating of the applied coating, the coating may have a greater thickness that still remains less than 10 nm.

The coating composition may be applied as a coating to any oxidizable metal surface and will greatly minimize, or even eliminate, oxidation of the oxidizable metal and thus will greatly minimize, or even eliminate, corrosion of the oxidizable metal. For example, the coating composition may be applied onto a conductive supporting frame, which is generally known as a "lead frame" in the microelectronics manufacturing industry. Lead frames are often made of an oxidizable metal, such as copper, aluminum, or a ferrous alloy.

Some examples of oxidizable metals that may be coated with the coating composition of the present invention include, but are not limited to copper; aluminum; nickel; ferrous alloys, such as steel; and any noble metal, such as gold, silver, platinum, palladium, and rhodium. Though noble metals are often considered to be somewhat resistant to corrosion, as compared to other metals, such as copper, aluminum, and nickel, noble metals and other corrosion resistant metals that are subject to oxidation, at least to some extent, are still considered to be oxidizable, as used herein.

The coating composition may be applied onto the oxidizable metal surface, such the oxidizable metal of a lead frame, using any conventional liquid coating application techniques. For example, the oxidizable metal surface may be dipped in the coating composition. As other non-exhaustive examples, the coating composition may be sprayed, dripped, or screen printed onto the oxidizable metal surface.

Prior to applying the coating composition onto the oxidizable metal surface, it is generally advisable to clean the oxidizable metal surface. The oxidizable metal surface may first be cleaned with an organic solvent like acetone, isopropanol or ethanol. A solution or solutions of a suitable organic acid, inorganic acid, organic base, and/or inorganic base may then be applied to stabilize any oxides already present on the oxidizable metal surface prior to applying the coating composition of the present invention. An aqueous solution containing about two weight percent sodium hydroxide or two weight percent phosphoric acid, based upon the total weight of the aqueous solution, has been found to satisfactorily stabilize any oxides already present on the oxidizable metal surface.

Following application, the coating composition is dried at a temperature between about 100° C. and about 150° C. to remove the liquid organic carrier and solidify the coating composition into the coating on the surface of the oxidizable metal. The temperature selected for drying the coating composition depends on the vapor pressure(s) of the liquid organic carrier(s) employed in the coating composition and therefore should be somewhat higher than the highest boiling point of any liquid organic carrier employed in the coating composition. The dry coating strongly adheres to the underlying oxidizable metal surface. This strong bonding does not significantly diminish with time.

In addition to inhibiting or even preventing corrosion of underlying oxidizable surfaces, coatings made of the coating composition also function as adhesion promoters for plastic layers (polymeric coatings, such as encapsulants and adhesives) applied onto the coatings of the coating composition. This is believed to be particularly true for plastic layers based on epoxy components that are cured following application to coatings of the inventive coating composition. Though not being bound by theory, it is believed a condensation reaction occurs between pendant hydroxyl (—OH) groups arising during curing of the epoxy coating and the substituent —R present in both compounds of formula I and compounds of formula II. It is thought this condensation reaction allows the overlying epoxy coating to chemically bond to the coating of the coating composition of the present invention.

In addition to plastic layers based on epoxy components, coatings made of the coating composition also function as adhesion promoters for plastic layers (polymeric coatings, such as encapsulants and adhesives) based upon silicon polymers and acrylic polymers that are applied onto the coatings of the coating composition. When plastic layers based upon acrylic polymers are applied onto the coatings of the coating composition the compound(s) capable of bonding to both oxidizable metal and a polymeric coating, the compound(s) should generally include a pair of carbon atoms that are double bonded to each other (C=C) to support stable chemical bonding of the compound(s) and the plastic layer(s) (polymeric coating, such as encapsulants and adhesives).

Following production of a lead frame, which serves as the base of a microelectronic device (e.g., a semiconductor device), other components are typically assembled onto the lead frame in the course of building the microelectronic device. For example, a microchip of semiconductor material may be attached to the lead frame. Different microelectronic devices may be linked together to create microelectronic articles by attaching different lead frames (with attached microchips) together in predetermined fashion. For example, different lead frames (with attached microchips) may be linked together by attaching the different lead frames via conductive adhesive to a printed circuit board, by soldering the lead frames to conductor tracks on a printed-circuit board, or by otherwise interconnecting different lead frames via conductive leads.

FIG. 1 illustrates one embodiment of an electronic device generally at 10. In the course of building a microelectronic device 10, a coating 12 of the coating composition may be formed on a lead frame 14 made of oxidizable metal to inhibit or eliminate corrosion of the underlying oxidizable metal. Then, a microelectronic component 16, such as, for example, a microchip of semiconductor material, may be attached to the lead frame 14 by a polymeric adhesive 18 that bonds to the coating 12 of the coating composition. It is believed that typical polymeric adhesives such as polymeric adhesives based on epoxy, silicon, and acrylic polymers will strongly and stably bond to the coating formed from the coating composition of the present invention.

In this arrangement, the coating of the coating composition both protects the oxidizable metal of the lead frame from corrosion and also supports adhesion of the adhesively attached semiconductor material (microchip) to the coating of the coating composition, and thus attachment of the semiconductor material (microchip) to the lead frame. Thus, even after attachment of the semiconductor material (microchip) to the lead frame, the corrosion prevention attributes of the coating of the inventive coating composition still remain. Furthermore, the coating of the inventive coating composition exhibits high thermal stability that helps the coating avoid separation or decomposition during any microelectronic device construction or application processes involving heat application to the microelectronic device, such as soldering.

Figure 2:
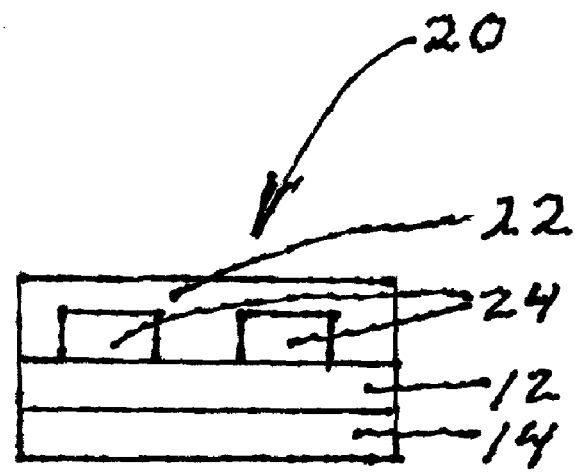
FIG. 2 is a schematic view of another embodiment of a microelectronic device incorporating a coating composition.

FIG. 2 illustrates another embodiment of an electronic device generally at 20. When building a microelectronic device 20, the coating 12 of the coating composition may be formed on the lead frame 14 made of oxidizable metal to inhibit or eliminate corrosion of the underlying oxidizable metal and support adhesion of plastic encapsulating material 22 in the course of packaging the microelectronic device. The plastic encapsulating helps to stabilize and secure microelectronic component(s) 24 mounted on the lead frame 14. It is believed that typical plastic encapsulating materials, such as plastic encapsulating materials based on epoxy, silicon, or acrylic polymers, will strongly and stably bond to the coating formed from the coating composition of the present invention.

In this arrangement, the coating of the coating composition both protects the oxidizable metal of the lead frame from corrosion and also supports adhesion of the plastic encapsulating material to the coating of the coating composition. Thus, even after attachment of microelectronic components to the lead frame and subsequent application of plastic encapsulating material to the microelectronic device, the corrosion prevention attributes of the coating of the inventive coating composition still remain. Furthermore, the coating of the inventive coating composition supports adhesion of the plastic encapsulating material to the microelectronic device.

Although various embodiments have been described herein, it will be appreciated by those of ordinary skill in the art that a variety of alternate and/or equivalent implementations may be substituted for the specific embodiments described herein without departing from the scope of the present invention. It should also be noted there are many alternative ways of implementing the methods and compositions of the present invention. This application is intended to cover any adaptations, alternatives, or variations of the embodiments described herein. Therefore, it is intended that the following appended claims be interpreted as including all such alterations, permutations, and equivalents as fall within the true spirit and scope of the present invention.

What is claimed is:

1. A coating composition, the coating composition comprising a compound having:

a first combination of atoms, the first combination of atoms comprising two or more ring nitrogen atoms of a heterocyclic organic ring, the first combination of atoms capable of bonding to an oxidizable metal or a metal oxide; and a second molecular group or a second combination of atoms, the second molecular group or the second combination of atoms capable of interacting with a precursor of a polymer so the compound and the polymer are bound together.

2. The coating composition of claim 1, wherein at least two of the ring nitrogen atoms are located adjacent to each other in the heterocyclic organic ring.

3. The coating composition of claim 1 wherein the second molecular group is a glycidyl group, an amino group, a hydroxyl group, or a thiol group.

4. The coating composition of claim 1 wherein the second combination of atoms is a pair of carbon atoms that are double bonded to each other.

5. The coating composition of claim 1 wherein the compound is a first compound represented by the following formula (I):

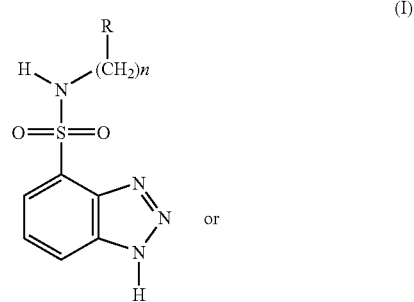

or a second compound represented by the following formula (II):

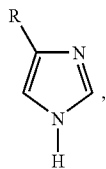

wherein:

—R may be —OH, —NH$_2$, —SH, or

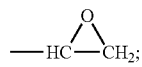

and n may be any whole number ranging from 1 to 12.

6. The coating composition of claim 1 wherein the oxidizable metal comprises copper; aluminum; nickel; a ferrous alloy, or a noble metal.

7. The coating composition of claim 1 wherein the polymer is an epoxy polymer, a silane polymer, or an acrylic polymer.

8. The coating composition of claim 1 wherein the concentration of the compound in the coating composition may range from as low as about 0.01 weight percent to as high as about 10 weight percent, based on the total weight of the coating composition.

9. The coating composition of claim 1, the coating composition further comprising an organic carrier.

10. An article, the article comprising oxidizable metal, the oxidizable metal bearing a coating of the coating composition of claim 1, the coating chemically bonded to the oxidizable metal.

11. The article of claim 10, the article further comprising an adhesive or an encapsulant chemically bonded to the coating.

12. The article of claim 11 wherein the adhesive or the encapsulant comprises an epoxy polymer chemically bonded to the coating, a silane polymer chemically bonded to the coating, or an acrylic polymer chemically bonded to the coating.

13. A semiconductor device comprising:

a lead frame;

a coating composition on the lead frame, the coating composition comprising a compound having:

a first combination of atoms, the first combination of atoms comprising two or more ring nitrogen atoms of a heterocyclic organic ring, the first combination of atoms capable of bonding to an oxidizable metal or a metal oxide; and a second molecular group or a second combination of atoms, the second molecular group or the second combination of atoms capable of interacting with a precursor of a polymer so the compound and the polymer are bound together; and a component associated with the lead frame.

14. A method, the method comprising preparing a coating composition comprising a compound having:

a first combination of atoms, the first combination of atoms comprising two or more ring nitrogen atoms of a heterocyclic organic ring, the first combination of atoms capable of bonding to an oxidizable metal or a metal oxide; and a second molecular group or a second combination of atoms, the second molecular group or the second combination of atoms capable of interacting with a precursor of a polymer so the compound and the polymer are bound together.

15. The method of claim 14, wherein at least two of the ring nitrogen atoms are located adjacent to each other in the heterocyclic organic ring.

16. The method of claim 14 wherein the second molecular group is a glycidyl group, an amino group, a hydroxyl group, or a thiol group.

17. The method of claim 14 wherein the second combination of atoms is a pair of carbon atoms that are double bonded to each other.

18. The method of claim 14 wherein the compound is a first compound represented by the following formula (I):

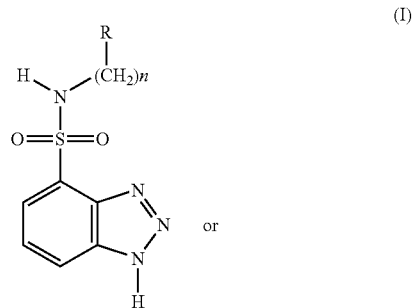

a second compound represented by the following formula (II):

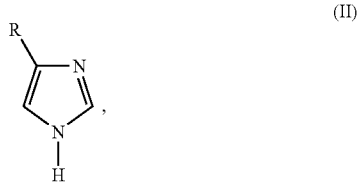

wherein:

—R may be —OH, —NH$_2$, —SH, or

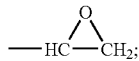

and n may be any whole number ranging from 1 to 12.

19. The method of claim 14, the method further comprising applying a coating of the coating composition onto the surface of an article, the surface comprising the oxidizable metal, the coating chemically bonding to the oxidizable metal.

20. The method of claim 19 wherein the oxidizable metal comprises copper; aluminum; nickel; a ferrous alloy, or a noble metal.

21. A method of making a semiconductor comprising:
preparing a coating composition comprising a compound having:
a first combination of atoms, the first combination of atoms comprising two or more ring nitrogen atoms of a heterocyclic organic ring, the first combination of atoms capable of bonding to an oxidizable metal or a metal oxide; and
a second molecular group or a second combination of atoms, the second molecular group or the second combination of atoms capable of interacting with a precursor of a polymer so the compound and the polymer are bound together;
applying the coating to a lead frame; and
attaching a component to the lead frame.

22. A coating composition, the coating composition comprising a compound having:
a first molecular group or a first combination of atoms, the first molecular group or the first combination of atoms capable of bonding to an oxidizable metal or a metal oxide; and
a second molecular group selected from a glycidyl, hydroxyl, or thiol group or a second combination of atoms comprising a pair of carbon atoms that are double bonded to each other, the second molecular group or the second combination of atoms capable of interacting with a precursor of a polymer so the compound and the polymer are bound together.

23. The coating composition of claim 22 wherein the first molecular group is a silanol group.

24. The coating composition of claim 22 wherein the first combination of atoms comprises two or more ring nitrogen atoms of a heterocyclic organic ring.

25. The coating composition of claim 24, wherein at least two of the ring nitrogen atoms are located adjacent to each other in the heterocyclic organic ring.

26. The coating composition of claim 22 wherein the compound is a first compound represented by the following formula (I):

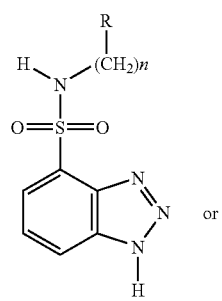

or a second compound represented by the following formula (II):

wherein:
—R may be —OH, —NH$_2$, —SH, or

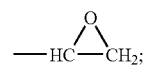

and
n may be any whole number ranging from 1 to 12.

* * * * *